(12) United States Patent  
Vashchenko

(10) Patent No.: US 8,451,569 B2  
(45) Date of Patent: May 28, 2013

(54) HIGH VOLTAGE TOLERANT, SMALL FOOTPRINT BJT-CMOS ACTIVE CLAMP

(75) Inventor: Vladislav Vashchenko, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 452 days.

(21) Appl. No.: 12/804,068

(22) Filed: Jul. 12, 2010

(65) Prior Publication Data

US 2012/0007648 A1   Jan. 12, 2012

(51) Int. Cl.
*H02H 9/00* (2006.01)
(52) U.S. Cl.
USPC ............................................. 361/56; 361/111

(58) Field of Classification Search
CPC .................................................. H01L 27/0266
USPC ........................................................ 361/56, 111
See application file for complete search history.

(56) References Cited

U.S. PATENT DOCUMENTS 7,280,328 B2 * 10/2007 Arai et al. ........................ 361/56
7,405,435 B2 *  7/2008 Sato .............................. 257/173

\* cited by examiner

*Primary Examiner* — Rexford Barnie
*Assistant Examiner* — Tien Mai
(74) *Attorney, Agent, or Firm* — Eugene C. Conser; Wade J. Brady, III; Frederick J. Telecky, Jr.

(57) ABSTRACT

In an active clamp implemented in a 5V complementary BiCMOS process, the footprint of the active clamp, which includes at least one NMOS clamp stack, is reduced by introducing a BJT into the circuit to allow the number of NMOS clamp stacks to be reduced.

5 Claims, 2 Drawing Sheets

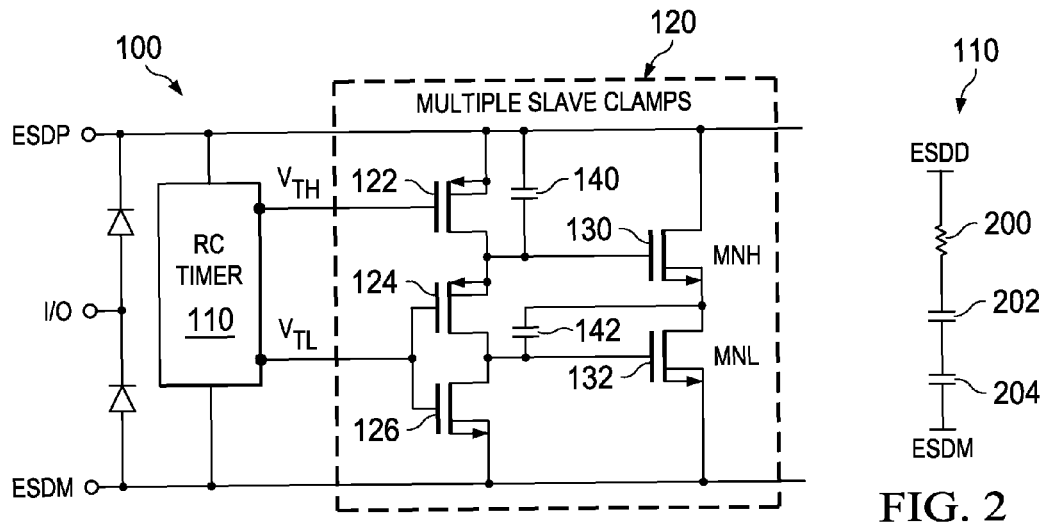
FIG. 1 (PRIOR ART)
FIG. 2 (PRIOR ART)
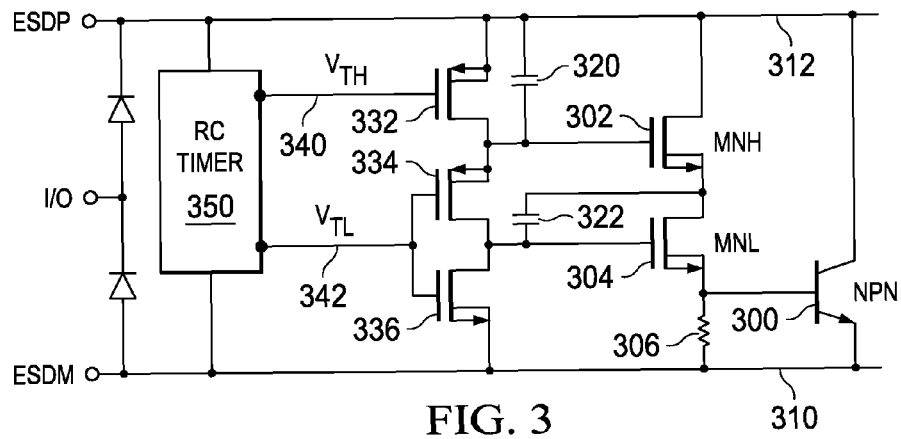
FIG. 3
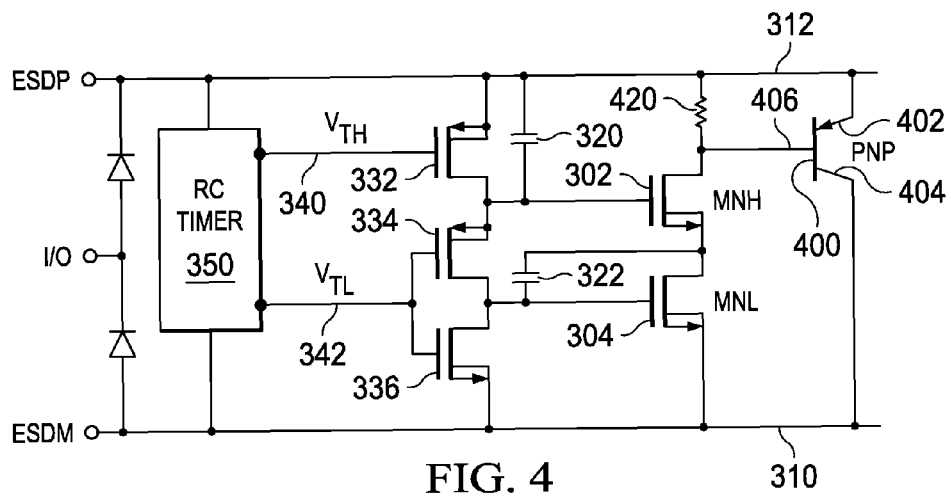
FIG. 4

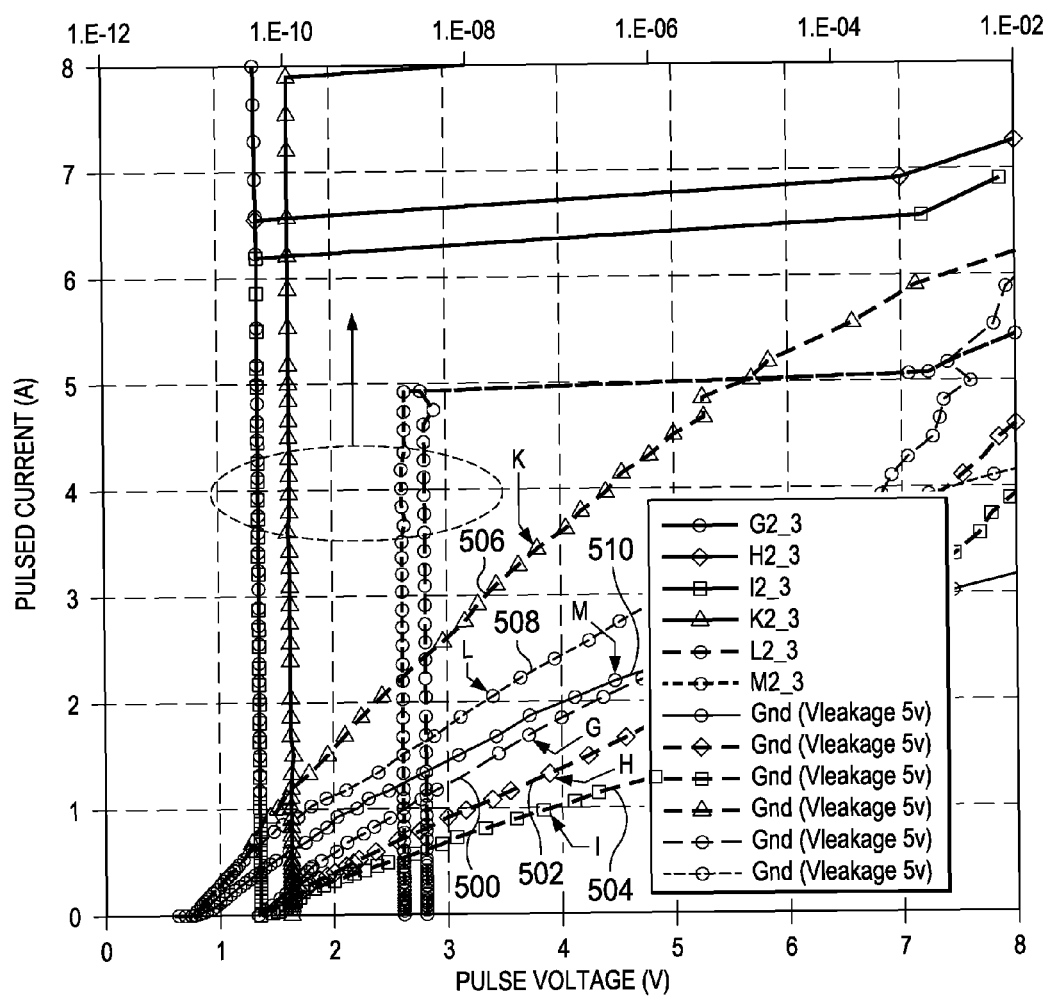

HIGH VOLTAGE TOLERANT, SMALL FOOTPRINT BJT-CMOS ACTIVE CLAMP

FIELD OF THE INVENTION

The invention relates to active ESD clamps. In particular it relates to low voltage CMOS-based clamps in a BiCMOS (Bipolar Complementary Metal Oxide Semiconductor Electrostatic Discharge) process.

BACKGROUND OF THE INVENTION

The complexity of dealing with a BiCMOS process that makes use of CMOS and BJT devices is that CMOS devices have a voltage tolerance of 2.5, 3.0 and 3.5 V, while BJT's typically have a voltage tolerance of 5V.

In a modular approach it is desirable to use mask sets that will support both high voltage bipolar devices as well as low voltage CMOS devices.

One prior art solution makes use of a stacked CMOS arrangements to withstand the 5V power supply. In particular, in the prior art solution shown in FIG. 1, the ESD clamp 100 includes an RC timer 110, one embodiment of which is shown in greater detail in FIG. 2. The RC timer 110 in the FIG. 2 embodiment comprises a resistor 200 and a stacked arrangement of two poly capacitors 202, 204. The RC timer 110 generates two levels of triggering signals VTH and VTL to control a slave clamp driver, indicated generally by reference numeral 120. The RC timer 110 thus provides a high voltage trigger signal VTH and a low voltage trigger signal VTL feeding a PMOS-NMOS inverter. In particular, the RC timer trigger signals control the gates of a distributed PMOS stack defined by PMOS 122, 124 to support the 5V power supply across rails ESDP-ESDM. As in a non-stacked version the PMOS devices define an inverter by including NMOS 126. Thus the PMOS devices 122, 124 and NMOS 126 define a stacked inverter to accommodate the 5V bipolar voltage. The slave clamp driver 120, in addition to the stacked inverter, includes multiple stacked power NMOS devices 130, 132 (only one shown in FIG. 1), which define the NMOS clamp stack. These NMOS devices, making up the NMOS clamp stack are 3V devices. The stacked arrangement of the power NMOS devices 130, 132 thus defines a high voltage NMOS 130 (MNH) and a low voltage NMOS 132 (MNL) to accommodate the 5V bipolar voltage. In practice multiple pairs of the power NMOS clamp stacks are arranged in parallel to be able to handle the high ESD pulse currents. In order to ensure rapid turn-on of the NMOS clamp stacks (in this case, the stack defined by NMOS devices 130, 132) during an ESD pulse, to avoid gate voltage breakdown due to a breakdown voltage differential across the drain and gate of the NMOS devices, speed-up capacitors 140, 142 are provided across the drain and gate of the power NMOS devices 130, 132. The speed-up capacitors 140, 142 thus provide for rapid turn-on of the NMOS devices 130, 132 when the fast rise time ESD pulse is applied between the ESDP and ESDM buses.

After a delay time as defined by the time constant of the RC circuit 110, the trigger signals VTH, VTL go high and the output from the stacked inverter, pulls the gates of power NMOS devices 130, 132 low to turn off the MNH and MNL of the NMOS clamp stack to define a high impedance state. In contrast, the slow rise time power supply ramp when power is applied to the circuit, ensures that the capacitors of the RC-timer 110 have time to charge up, keeping the power NMOS devices 130, 132 in the off state.

In the circuit diagram of FIG. 1, the slave clamp 120 is depicted as comprising a single NMOS clamp stack defined by two power NMOS devices 130, 132, however in practice more than one NMOS clamp stack may be provided to handle the ESD current pulse. The problem is that NMOS devices are inherently large. Therefore, having to cascade multiple NMOS clamp stacks in parallel to handle the large ESD currents, results in a very large footprint ESD clamp.

SUMMARY OF THE INVENTION

According to the invention, there is provided an active clamp implemented in a complementary BiCMOS process, comprising an RC timer circuit controlling a slave clamp structure that includes a stacked inverter, which controls an NMOS clamp stack, the active clamp further including a BJT having a control gate that is connected to an output of the NMOS clamp stack. The NMOS clamp stack may comprise a first NMOS device connected with its source to the drain of a second NMOS device. The active clamp may include more than one NMOS clamp stack arranged in parallel. The stacked inverter may comprise a stacked arrangement of at least two PMOS devices and an NMOS device. The first and second NMOS devices of the clamp stack may be connected between a high voltage bus and a low voltage bus. The BJT may comprise a PNP device connected with its base as a high side driver in which the base of the PNP device is connected to the drain of the first NMOS device and the drain of the first NMOS device is connected via a resistor to the high voltage bus. The BJT may comprise an NPN device connected as a common emitter in which the base of the NPN device is connected to the source of the second NMOS device and the source of the second NMOS device is connected via a resistor to the low voltage bus. Preferably each slave clamp includes a first speed-up capacitor connected between the high voltage bus and the gate of the first NMOS device, and a second speed-up capacitor connected between the drain and gate of the second NMOS device.

Further, according to the invention there is provided a method of reducing the footprint of an active clamp implemented in a complementary BiCMOS process, comprising an RC timer circuit controlling a slave clamp structure that includes a stacked inverter, which controls at least one NMOS clamp stack, each NMOS clamp stack having multiple stacked NMOS devices, the method comprising reducing the number of NMOS clamp stacks required for carrying ESD current by connecting a BJT to an output of the at least one NMOS clamp stack to define a small footprint ESD current carrying structure. The stacked inverter may comprise a multiple stacked PMOS devices and an NMOS device.

BRIEF DESCRIPTION OF THE DRAWINGS

FIG. 1 is a schematic circuit diagram of a prior art CMOS clamp usable in a BiCMOS process, FIG. 2 is a schematic circuit diagram of an RC timer for use with the CMOS clamp of FIG. 1, FIG. 3 is a schematic circuit diagram of one embodiment of an active clamp implementation in a 5V complementary BiCMOS process, of the invention, and FIG. 4 is a schematic circuit diagram of another embodiment of an active clamp implementation in a 5V complementary BiCMOS process, of the invention.

FIG. 5 shows experimental TLP analysis of various embodiments of the invention, with different number of NMOS clamp stacks.

DETAILED DESCRIPTION OF THE INVENTION

In order to accommodate the 5 V complementary BiCMOS bus voltage, the CMOS devices are implemented as stacked devices. In the case of a clamp that makes use of a slave clamp structure comprising a PMOS/NMOS inverter and a power NMOS active clamp, the inverter is implemented as a stacked or cascaded PMOS structure with an NMOS device to define a stacked inverter, while the power NMOS is implemented as a stacked or cascaded arrangement of NMOS devices to define an NMOS clamp stack. Furthermore, the number of the NMOS clamp stacks have to be kept sufficiently large to accommodate the ESD discharge pulse currents. In other words the total width of the NMOS clamp stack arrangement has to be wide enough to accommodate the ESD current. Thus the CMOS based clamp structures implemented in a BiCMOS process tend to have a very large footprint.

The present invention provides a way of reducing the width of the active clamp by providing a BJT (bipolar junction transistor device) to help sink the high ESD current pulse.

In the embodiment of FIG. 3, the slave clamp defined by the stacked structure for the inverter and at least one power NMOS clamp stack is retained but an NPN transistor 300 is connected as an emitter follower to the output of the last NMOS clamp stack. In the embodiment of FIG. 3, only one NMOS clamp stack is retained, defined by the high voltage NMOS 302 and low voltage NMOS 304. A resistor 306 is provided between the source of the NMOS 304 and the low voltage bus (ESDM) 310. As in the prior art structure a speed-up capacitor 320 is provided between the gate of the high voltage NMOS 302 and the high voltage bus 312. I speed-up capacitor 322 is also provided between the drain and gate of NMOS 304. The stacked inverter is defined by two PMOS devices 330, 334 and an NMOS device 336. The cascaded inverter receives a high and a low triggering voltage (VTH, and VTL, respectively) on lines 340 and 342, respectively from an RC timer circuit 350.

Another embodiment of a 5V complementary BiCMOS active clamp circuit of the invention is shown in FIG. 4. This embodiment is similar to that of FIG. 3 and corresponding structures are therefore numbered the same as in the FIG. 3 embodiment. The embodiment of FIG. 4 differs in that it makes use of a PNP device to sink ESD pulse current. The PNP device 400 is connected with its emitter 402 to the high voltage bus 312 and with its collector 404 to the low voltage bus 310. The gate 406 is connected to the drain of NMOS 302, which is also connected via a resistor 420 to the high voltage bus 312.

Experimental TLP analysis of various embodiments of the invention, with different numbers of NMOS clamp stacks is shown in FIG. 5.

Curve 500 (G) made use of a 1080×0.24 μm² NPN based clamp; curve 502 (H) made use of an NPN clamp that was half the size at 540×0.24 μm²; curve 504 (I) made use of the same NPN clamp arrangement as curve 502 but reduced the width of the NMOS clamp stack arrangement by a factor of 3 by using a third of the number of NMOS clamp stacks compared to the arrangement of curve 502.

Curve 506 (K) shows the results for a 1080×0.24 μm² PNP clamp; curve 508 (L) shows the results for a 540×0.24 μm² PNP clamp; curve 510 shows the results for the clamp of curve L with a 3 times reduction in the width of the NMOS clamp stack arrangement by using only a third of the number of NMOS clamp stacks.

The curves show that the PNP clamp provided a higher pulsed ESD current sinking capability over the NPN, however both provided improvements (increased pulsed current handling) over structures without BJT clamp. Also, even when the number of NMOS clamp stacks in the NMOS clamp stack arrangement were reduced to one third, the current handling capability at 4 V was reduced only by about 40% when used with an NPN clamp structure, and was reduced only by about 25% when used with a PNP clamp structure. Also, a two-fold reduction in the size of the BJT resulted in only a 30% loss in the pulsed current handling capability.

Thus the present invention provides in substantial space saving by making use of a relatively small BJT structure to eliminate the need for multiple NMOS clamp stacks in the slave clamp.

While the application was described with respect to specific embodiments, it will be appreciated that the invention is not limited to the specific embodiments but includes other embodiments as defined by the claims.

What is claimed is:

1. An active clamp implemented in a complementary BiCMOS process, comprising an RC timer circuit, slave clamp structure that includes a stacked inverter controlled by the RC timer circuit, an NMOS clamp stack controlled by the slave clamp structure, and a BJT having a control gate that is connected to an output of the NMOS clamp stack;
   wherein the NMOS clamp stack includes a first NMOS device connected with its source to the drain of a second NMOS device;
   wherein the BJT comprises a PNP device connected with its base as a high side driver in which the base of the PNP device is connected to the drain of the first NMOS device and the drain of the first NMOS device is connected via a resistor to the high voltage bus.

2. An active clamp 1, wherein the stacked inverter comprises a stacked arrangement of at least two PMOS devices and an NMOS device.

3. An active clamp of claim 2, wherein the first and second NMOS devices of the clamp stack are connected between a high voltage bus and a low voltage bus.

4. An active clamp of claim 1, wherein each slave clamp includes a first speed up capacitor connected between the high voltage bus and the gate of the first NMOS device, and a second speed-up capacitor connected between the drain and gate of the second NMOS device.

5. An active clamp implemented in a complemented in a complementary BiCMOS process, comprising an RC timer circuit,
   slave clamp structure that includes a stacked inverter controlled by the RC timer circuit,
   an NMOS clamp stack controlled by the slave clamp structure, and
   a BJT having a control gate that is connected to an output of the NMOS clamp stack;
   wherein the NMOS clamp stack includes a first NMOS device connected with its source to the drain of a second NMOS device;
   wherein the BJT comprises an NPN device connected as a common emitter in which the base of the NPN device is connected to the source of the second NMOS device and the source of the second NMOS device is connected via a resistor to the low voltage bus.

* * * * *